Jan. 18, 1966
M. I. GRACE
HIGH FREQUENCY PARAMETRIC AMPLIFIER
WITH INTEGRAL CONSTRUCTION
Filed Sept. 26, 1962
3,230,464
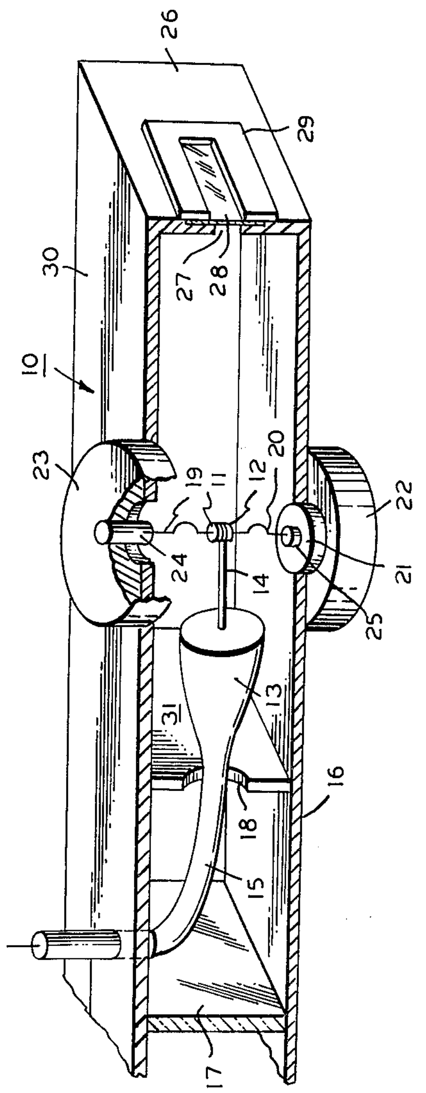
INVENTOR
MARTIN I. GRACE
BY Alfred B. Levine
ATTORNEY 3,230,464

HIGH FREQUENCY PARAMETRIC AMPLIFIER WITH INTEGRAL CONSTRUCTION

Martin I. Grace, Wayne, N.J., assignor, by mesne assignments, to Airtron, Inc., Division of Litton Industries, Inc., Morris Plains, N.J.

Filed Sept. 26, 1962, Ser. No. 226,257
5 Claims. (Cl. 330—4.9)

This invention relates to parametric amplifiers and to processes of making such amplifiers, and is particularly concerned with improvements in such amplifiers for application at higher frequencies than heretofore available, up to and exceeding the X band of frequencies of 9 to 12 kilomegacycles, and higher.

Very generally according to a preferred embodiment of the present invention there is provided a miniaturized parametric amplifier of integrated construction, and employing a pair of closely matched voltage variable capacitor semiconductor diodes in balanced amplifier configuration wherein the pump power is applied to the reactances in series and the signal is applied thereto in parallel. The semiconductor diodes are in the form of unhoused semiconductor dice that are hermetically sealed within a miniature container that is not much larger than the tiny dice. The container is pressurized with a neutral gas to passivate the diodes, and the elimination of the individual housings for the diodes not only permits reduction of the size in the container as desired for higher frequency applications but materially reduces the shunt capacitance normally provided by the housings. This produces a much higher dynamic Q, or figure of merit, of the diodes, and greatly increases the operating cutoff frequency without detrimentally increasing the spreading resistance of the semiconductor diodes. Since the noise factor and gain bandwidth product of the amplifier are also dependent upon the operating cutoff frequency and dynamic Q of the diode, these factors are also materially improved by this construction.

In the integrated construction of the preferred amplifier, the semiconductor dice are formed into diodes during the assembly of the diodes within its sealed container, permitting critical adjustments to be made of the pressure of the point contact made between the wire lead and the semiconductor dice. This enables the characteristics of the reactances to be precisely controlled, and the diodes to be precisely matched as required for the balanced configuration desired.

Among many other features of this improved amplifier construction, is an improved manner of introducing the pump energy and introducing the signal through a novel mode transducer, both of which are compatible with the intended higher frequency of operation of the amplifier as well as sufficiently flexible in operation to permit mechanical and electronic frequency tuning of the amplifier over extended ranges of operation.

It is accordingly a principal object of the invention to provide a parametric amplifier of improved configuration and construction for application at higher frequencies than heretofore.

A further object is to provide such an amplifier having a lower noise factor and an improved gain bandwidth product.

A still further object is to provide such an amplifier employing capacitive semiconductors in a configuration having a higher operating cutoff frequency and an improved dynamic Q, or figure of merit.

Another object is to provide such an amplifier of simplified construction and considerably smaller in size.

Still another object is to provide a process for constructing the semiconductor diodes integrally during the construction of the amplifier, whereby the characteristics of the diodes may be precisely controlled and matched.

A still further object is to provide an improved process for constructing a hermetically sealed parametric amplifier employing a pair of semiconductor diodes in a balanced configuration wherein the characteristics of the diodes may be adjustably matched during the assembly of the amplifier.

Other objects and additional advantages will be more readily understood by those skilled in the art after a detailed consideration of the following specification taken with the accompanying single figure of drawing illustrating in a perspective, partially cut away view, one preferred embodiment of the invention.

Referring now to the drawing there is shown a preferred parametric amplifier construction generally comprising a miniature hermetically sealed container 10 filled with a pressurized neutral gas, such as nitrogen, and containing therein a pair of voltage variable semiconductor diodes 11 and 12, centrally suspended therein, in the form of unhoused semiconductor dice.

The container 10 may be in the form of a rectangularly shaped waveguide section sealed by end walls 26 and 17, as shown. The voltage variable semiconductor diodes, known in the art as "varactors," are oppositely connected back-to-back, and having point contact junctions being provided by the wires 19 and 20 which engage the oppositely exposed faces of the two semiconductor dice 11 and 12. At the opposite free ends of the point contacting wires 19 and 20, there are connected small conducting pins 24 and 25, respectively, which pins 24 and 25 are fastened to and make electrical contact with the upper and lower walls of the waveguide 10. Thus the wires 19 and 20 provide both the electrical point contact to the semiconductor dice, forming the diodes, as well as mechanically supporting the diodes 11 and 12 in the suspended position shown within the miniature sealed waveguide.

An input signal is introduced into the sealed waveguide 10 by means of a coaxial line 15 and a mode transducing balun section 13, with the central conductor 14 leading from the balun section 13 being fastened to and electrically in contact with the engaging surfaces of the semiconductor diodes. The function of the balun section is to change the propagation mode of the input signal from TE to TEM for the waveguide, and the flair of the balun is constructed to impedance match the coaxial line 15 to the sealed waveguide container.

Since the input signal is introduced to the commonly connected faces of the semiconductor dice 11 and 12, and the opposite point contacting wires 19 and 20 leading from the dice are respectively connected to the upper waveguide wall 30 and lower waveguide wall 16, respectively, it is evident that the input signal is directed to both diodes in parallel and thus at the signal frequency the diodes 11 and 12 appear in parallel circuit configuration. The balun section 13 may be considered in its equivalent as a combined mode transducer and a broadband transformer, and the short section of conductor 14 leading therefrom functions as an inductance. Consequently, at the signal frequency, the length of the conductor 14 is chosen to provide an inductance that resonates with the sum of the capacitances of the two diodes 11 and 12 (parallel connected).

For introducing the pump signal into the container 10, there is provided a low Q resonant slot 27 containing a microwave window 28 in the end wall 26 of the waveguide 10. Since the diodes 11 and 12 are oppositely connected between the upper and lower walls of the waveguide 10 and the pump signal is introduced through the window 28, the diodes 11 and 12 are presented in series to the pump signal. Consequently, the self resonant frequency of the two diodes in series is chosen as the idler frequency.

As is well known in the art, the pump source (not shown) may be any one of several known types of generators, such as a klystron, backward wave oscillator, carcinotron or the like, and this source is suitably coupled to the end wall 26 of the waveguide to introduce pump energy through the slot 27 and window 28 in the manner described.

The output signal obtained from the amplifier is directed outwardly over conductor 14, through the balun section 13, and over coaxial section 15 in the same path as is the input signal, and this output signal may be distinguished and separated from the input signal externally of the amplifier by employing a directional coupler (not shown) or other known means as is known in the art.

Alternatively, a second balun section and coaxial line (not shown), but similar to balun 13 and conductor 14, may be provided at the opposite end of the waveguide section to provide a straight-through amplifier having an outlet coaxial line extending through or near the end wall 26. With this modified construction, the pump frequency signal may be introduced through a slot and window such as 27 and 28 being located in either of the side walls.

According to a preferred process for constructing this miniature amplifier, the diodes 11 and 12 are formed and positioned in the cavity integrally during the construction of the amplifier to insure that the diode leads or whiskers 19 and 20 are properly located at right angles to the semiconductor dice surfaces, and that the critical point contact pressure between these wires and the dice is correct to provide the characteristics desired.

More specifically, in the construction of the amplifier, waveguide 10 is first constructed having the hermetically sealed window 28 therein in the end wall 26 as shown. The semiconductor dice 11 and 12 (without the wires 19 and 20) are then mounted on and connected to the balun conductor 14, which assembly is made externally of the cavity 10. Afterward the balun assembly with its connected semiconductor dice thereon is introduced into the waveguide and the dice are centrally positioned as shown.

In the meanwhile, the point contact leads 19 and 20 are individually mounted on their pins 24 and 25, respectively, each being located within a large plug such as 21, and these wires are then fed into the container through the openings provided in the upper and lower walls 30 and 16, to make point contact with the confronting surfaces of the semiconductor dice 11 and 12. Contact is made between the points or ends of the wires 19 and 20 and the associated semiconductor surfaces by pressing on the pins 24 and 25 located in the center of the large plugs 21. To obtain the diode characteristics desired, the amount of physical pressure that the wires exert on the surface of the dice is critical and this pressure is adjusted until the desired pressure is obtained.

After the desired adjusted pressure contact is made between the wires and the dice, the diode junction is formed by electrically pulsing the wires 19 and 20 with short pulses of current. The large plugs 21 are rigidly fastened to the upper and lower walls 30 and 16 of the waveguide to provide rigidity to the assembly, and prevent any accidental movement of the wires 19 and 20 thereafter which might disturb or destroy the critical point contacts.

When the amplifier parts have been completed and assembled as described, hermetic sealing covers, such as 22 and 23 are then fastened over the plugs 21 to seal the openings in the waveguide walls. Thereafter the cavity 31 is evacuated and pressurized with a dry inert gas, such as nitrogen, and the opposite end wall such as 17 is hermetically sealed in place to complete the unit.

Although but one preferred embodiment of the amplifier and process of its construction has been illustrated and described, many variations may be made without departing from the spirit and scope of this invention. Accordingly, this invention should be considered as being limited only by the following claims appended hereto.

What is claimed is:

1. A parametric amplifier comprising:
a sealed microwave cavity containing a neutral gas,
a pair of semiconductor capacitive diode dice disposed in series back-to-back relationship within the cavity with the opposite terminals of the diodes being grounded to the cavity walls,
a balun for introducing a signal to the amplifier and having a central and outer conductor penetrating the wall of the cavity with the central conductor being connected to the junction of the diodes,
said diode dice being unhoused and exposed to the neutral gas within the cavity,
and means including a sealed window provided in the cavity for introducing a source of pumping power to energize the diodes.

2. In the amplifier of claim 1, a second balun having central and outer conductor, with the central conductor coupled to the common junction of the dice.

3. In the amplifier of claim 2, said microwave cavity having end walls and side walls with the first and second balun introduced into the cavity proximate the opposite end walls and said microwave window being disposed in one of the side walls.

4. A parametric amplifier in a balanced configuration comprising:
a pair of suspended series connected point contact semiconductor diodes that are unhoused,
a hermetically sealed miniature container that is not much larger than the diodes, with said container enclosing said diodes,
a neutral gas within the container for passivating the unhoused diodes,
said diodes being interconnected at a common junction in back-to-back relationship with one electrode of each diode being electrically connected to the container by its point contact conductor and said diodes being suspended within said container by said conductors,
means including a sealed microwave window provided in said container for receiving pumping power applied to said diodes in series circuit configuration,
a mode transducer and impedance transforming coupling means for introducing a microwave signal into said container and energizing said diodes in parallel circuit configuration,
said coupling means providing a hermetically sealed electrical connection through a wall of said container,
said coupling means including a series inductance for resonating with the sum of the capacitances of the diodes at the frequency range of operation of the amplifier.

5. In the amplifier of claim 4, said coupling means including a balun section having a central conductor being connected to the common junction of the back-to-back diodes.

References Cited by the Examiner

UNITED STATES PATENTS

| | | | |
|---|---|---|---|
| 3,105,941 | 10/1963 | Kliphuis | 330—4.9 |
| 3,165,818 | 1/1965 | Soffa et al. | 29—155.5 |
| 3,176,382 | 4/1965 | Dickson et al. | 29—155.5 |

OTHER REFERENCES

Kliphuis, "Proceedings of the IRE," May 1961, page 961.

ROY LAKE, *Primary Examiner.*

D. R. HOSTETTER, *Assistant Examiner.*